United States Patent
Hessburg et al.

(10) Patent No.: US 6,241,427 B1
(45) Date of Patent: Jun. 5, 2001

(54) SYSTEM AND METHOD FOR SUBSTANTIALLY TOUCHLESS HYDRODYNAMIC TRANSPORT OF OBJECTS

(75) Inventors: Merilly Ann Hessburg, Fremont; Timothy John Lindsley, San Jose; David Craig Darrow; John Edgar Sheffield, both of Pleasanton, all of CA (US)

(73) Assignee: Seagate Technology, Inc., Scotts Valley, CA (US)

( * ) Notice: Subject to any disclaimer, the term of this patent is extended or adjusted under 35 U.S.C. 154(b) by 0 days.

(21) Appl. No.: 09/196,856

(22) Filed: Nov. 20, 1998

(51) Int. Cl.[7] .................... B65G 53/16; B65G 53/28; B65G 53/38; B65G 69/06
(52) U.S. Cl. .................... 406/88; 406/93; 406/134; 414/935; 414/939; 414/217; 134/64 R; 134/122 R; 134/184; 134/199
(58) Field of Search .................... 406/88, 93, 87, 406/85, 95, 112, 134, 136, 137, 147, 153, 94; 414/935, 939, 217; 134/184, 199, 64 R, 122 R

(56) References Cited

U.S. PATENT DOCUMENTS

| | | | |
|---|---|---|---|
| 3,718,371 | * | 2/1973 | Lasch, Jr. ............... 406/88 |
| 3,734,567 | * | 5/1973 | Fong ....................... 406/86 |
| 3,773,391 | * | 11/1973 | Crandall et al. ........ 406/88 |
| 3,796,466 | * | 3/1974 | Lasch, Jr. ............... 406/88 |
| 4,027,246 | * | 5/1977 | Caccoma et al. ...... 364/468.28 |
| 4,236,851 | * | 12/1980 | Szasz ...................... 406/72 |
| 4,293,249 | * | 10/1981 | Whelan ................... 406/72 |
| 4,401,131 | * | 8/1983 | Lawson ................... 134/149 |
| 4,402,613 | * | 9/1983 | Daly et al. . |
| 4,587,002 | * | 5/1986 | Bok ......................... 204/298.25 |
| 4,795,299 | * | 1/1989 | Boys et al. ............. 414/217 |
| 4,993,885 | * | 2/1991 | Lazzari ................... 406/89 |
| 5,017,052 | * | 5/1991 | Bartylla ................... 406/88 |
| 5,209,387 | * | 5/1993 | Long et al. ............. 226/97 |
| 5,213,451 | * | 5/1993 | Frank et al. ............ 406/72 |
| 5,988,631 | * | 11/1999 | Hewit ..................... 271/195 |
| 6,042,307 | * | 3/2000 | Lenhart ................... 406/88 |

* cited by examiner

*Primary Examiner*—Christopher P. Ellis
(74) *Attorney, Agent, or Firm*—Merchant & Gould P.C.

(57) ABSTRACT

A object processing system is disclosed. The object processing system includes processing modules for performing process steps on objects, and hydrodynamic transport chutes coupled between the processing modules for transporting the object in a substantially touchless manner between the processing modules. Each substantially touchless hydrodynamic transport chute includes a transfer slot formed between two walls. Formed in the walls and directed into the transfer slot are support nozzles angled towards the output side of the transfer slot for creating fluid flow and fluid bearings in the transfer slot and urging objects through the transfer slot. In addition, induction nozzles are formed in the walls near the input side of the transfer slot for inducing objects into the input side of the transfer slot. A base supports the first and second walls and is grooved in substantial alignment with the transfer slot for receiving and bottom-centering objects in the transfer slot.

14 Claims, 13 Drawing Sheets

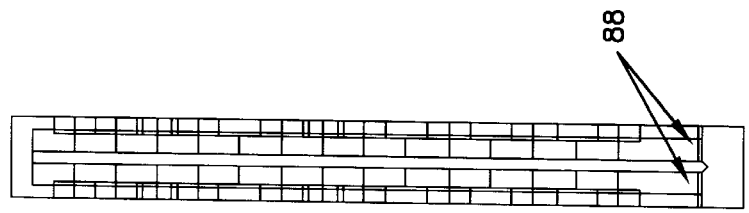
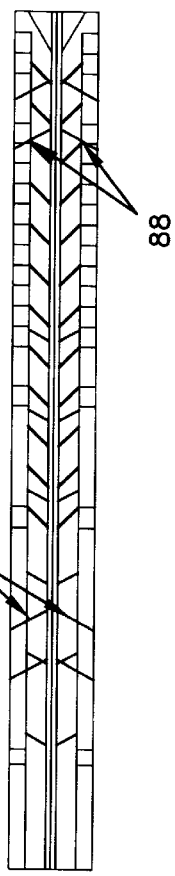
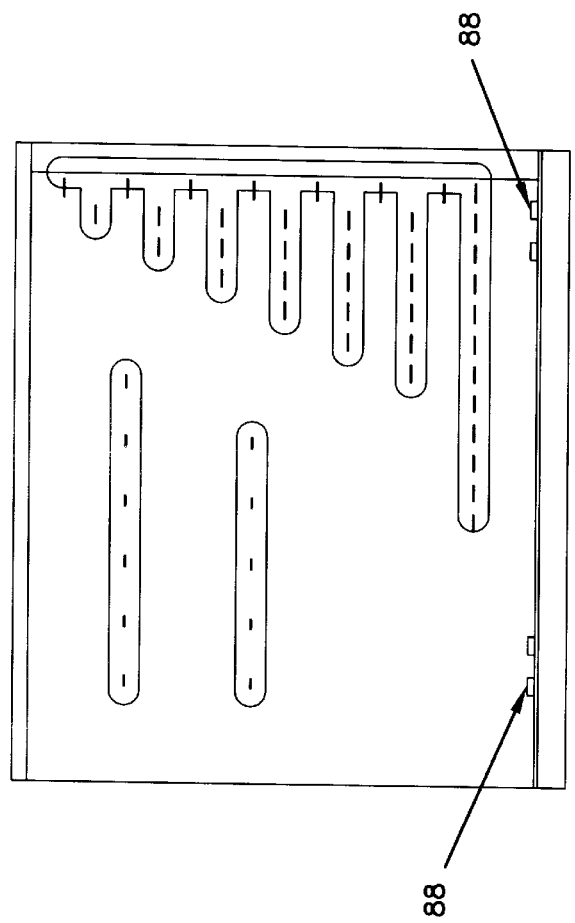
FIG. 18
FIG. 16
FIG. 17

SYSTEM AND METHOD FOR SUBSTANTIALLY TOUCHLESS HYDRODYNAMIC TRANSPORT OF OBJECTS

BACKGROUND OF THE INVENTION

1. Field of the Invention

Embodiments of this invention relate generally to the transport of objects between various manufacturing process steps, and in particular embodiments to methods for the substantially touchless hydrodynamic transport of objects between manufacturing process steps, and systems incorporating the same.

2. Description of Related Art

Modern manufacturing methods often require a number of processing steps to be performed on an object to transform or prepare the object into a finished product. Even after the object has been fabricated, cleaning steps may be required to remove residue and contaminants such as particulates, organics, and inorganics collected during processing. For example, in conventional magnetic recording media processing techniques a slurry is applied to texture the surface of the magnetic media. This slurry must subsequently be removed, often by mechanically scrubbing the magnetic recording media using polyvinyl alcohol (PVA) rollers. Several cleaning steps may be required, because magnetic recording media often requires particle removal efficiencies as small as 0.3 microns, and inorganic/organic particulate levels as low as $1 \times 10^{10}$ atoms/cm$^2$.

Careful handling is essential as these fragile objects are transported between process steps. Conventional techniques employed for transporting delicate objects such as semiconductor wafers and magnetic recording media between process stations may require both mechanical and human intervention. This intervention creates a number of potential problems. Once the object completes a processing step, it is loaded into a transportation cassette, carried by process operators to the next processing station, and unloaded from the cassette. Such techniques increase the chance of frictional wear and damage to the object as it comes into contact with the cassettes and human hands, and increases the chance of breakage of the object due to dropping or other mishandling. Contaminants may also be introduced during the handling and transportation process. No processing steps can be performed during the manual transportation process, making it a non-value-added manufacturing step. Manual transportation techniques also may be slower due to the lack of automation and required human intervention, and may be costlier due to the employment of process operators.

SUMMARY OF THE DISCLOSURE

Therefore, it is an object of embodiments of the invention to provide a system and method for the substantially touchless hydrodynamic transport of objects between manufacturing process steps to minimize frictional wear and damage to the object. Touchless, as defined herein, is the absence of contact with solid surfaces.

It is a further object of embodiments of the invention to provide a system and method for the substantially touchless hydrodynamic transport of objects between manufacturing process steps to minimize the chance of breakage of the object due to dropping or other mishandling.

It is a further object of embodiments of the invention to provide a system and method for the substantially touchless hydrodynamic transport of objects between manufacturing process steps to minimize the introduction of contaminants.

It is a further object of embodiments of the invention to provide a system and method for the substantially touchless hydrodynamic transport of objects between manufacturing process steps wherein additional process steps can be performed during the substantially touchless transportation process.

It is a further object of embodiments of the invention to provide a system and method for the substantially touchless hydrodynamic transport of objects between manufacturing process steps to increase the speed and efficiency of the manufacturing process while decreasing its costs by automating the transport process.

These and other objects are accomplished according to a substantially touchless hydrodynamic transport chute. Each substantially touchless hydrodynamic transport chute includes a transfer slot formed between two walls. Formed in the walls and directed into the transfer slot are support nozzles angled towards the output side of the transfer slot for creating fluid flow and fluid bearings in the transfer slot and urging objects through the transfer slot. In addition, induction nozzles are formed in the walls near the input side of the transfer slot for inducing objects into the input side of the transfer slot. A base supports the first and second walls and is grooved in substantial alignment with the transfer slot for receiving and bottom-centering objects in the transfer slot.

These and other objects, features, and advantages of embodiments of the invention will be apparent to those skilled in the art from the following detailed description of embodiments of the invention, when read with the drawings and appended claims.

BRIEF DESCRIPTION OF THE DRAWINGS

FIG. 16 is a top view, partially cut away, of a substantially touchless hydrodynamic transport chute showing drain angles according to an embodiment of the invention.

FIG. 17 is a side view, partially cut away, of a substantially touchless hydrodynamic transport chute showing drain locations according to an embodiment of the invention.

FIG. 18 is an end view, partially cut away, of a substantially touchless hydrodynamic transport chute showing drain locations according to an embodiment of the invention.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

Modern manufacturing methods for producing objects of a particular composition often require a number of processing steps before a finished product is created. Even after the object has been fabricated, multiple cleaning steps may be required to remove residue and contaminants collected during processing. For example, complex multilayered objects such as semiconductor wafers or magnetic recording media may require the removal of certain chemical compositions applied during fabrication by repeatedly scrubbing the surface of the object in different cleaning steps. Careful handling is essential as these fragile objects are transported between cleaning steps.

Figure 1:
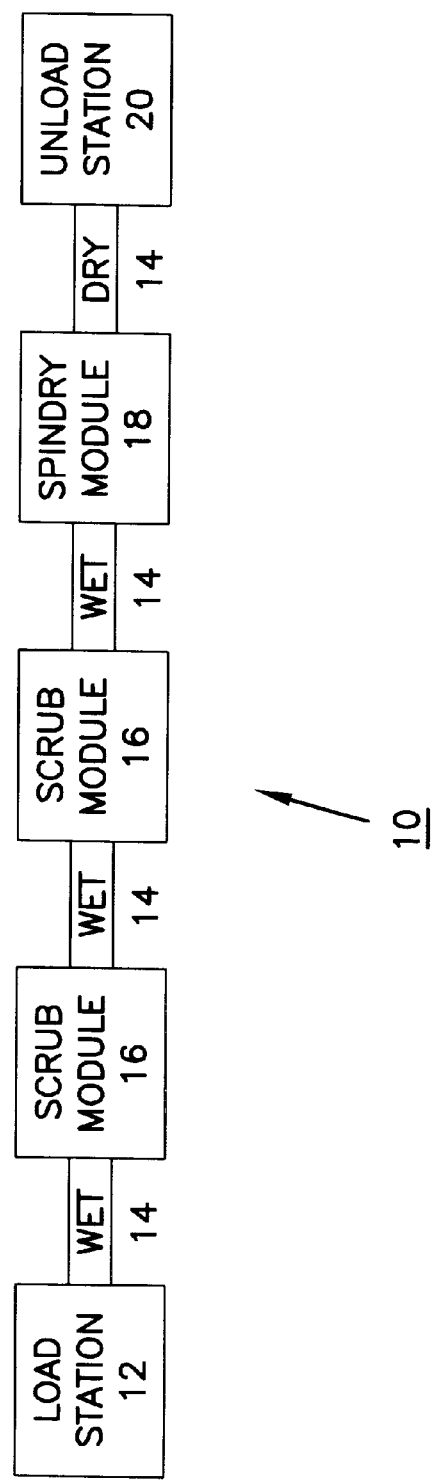
FIG. 1 is a block diagram of a manufacturing system including the substantially touchless hydrodynamic transport of objects between manufacturing process steps according to an embodiment of the invention.
Figure 2:
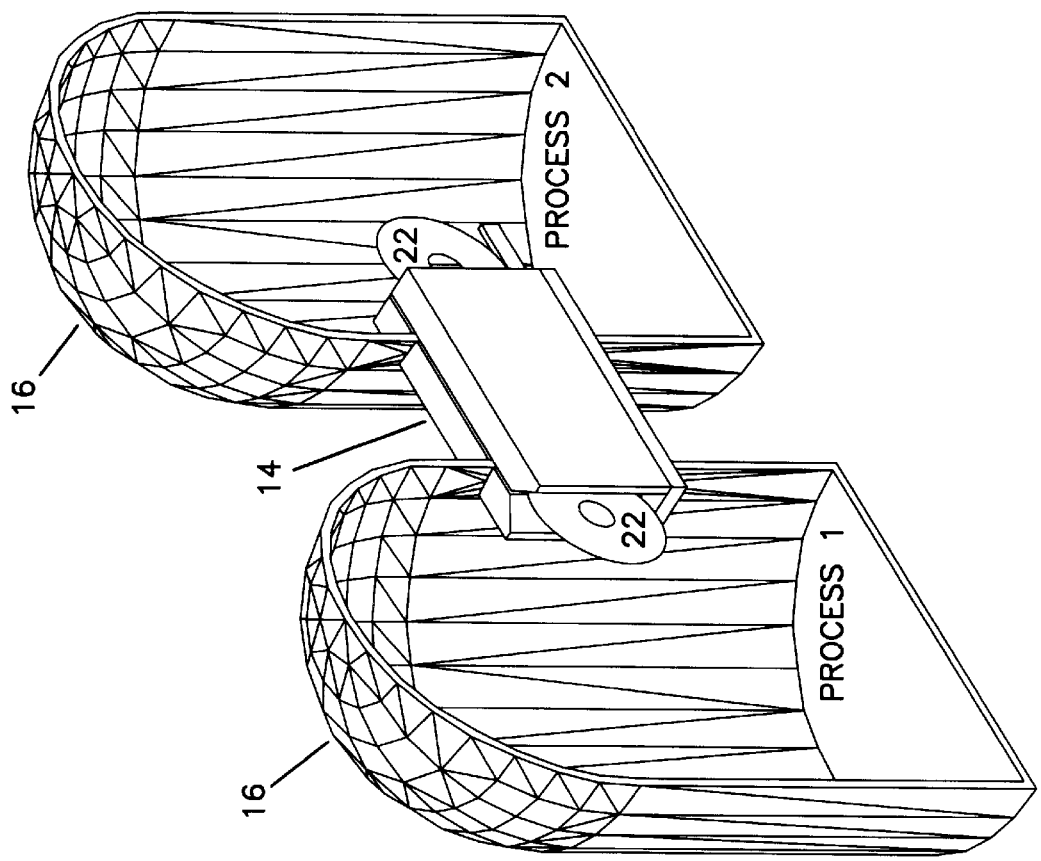
FIG. 2 is a perspective view, partially cut away, of a substantially touchless hydrodynamic transport chute bridging two modules for performing manufacturing process steps according to an embodiment of the invention.
Figure 3:
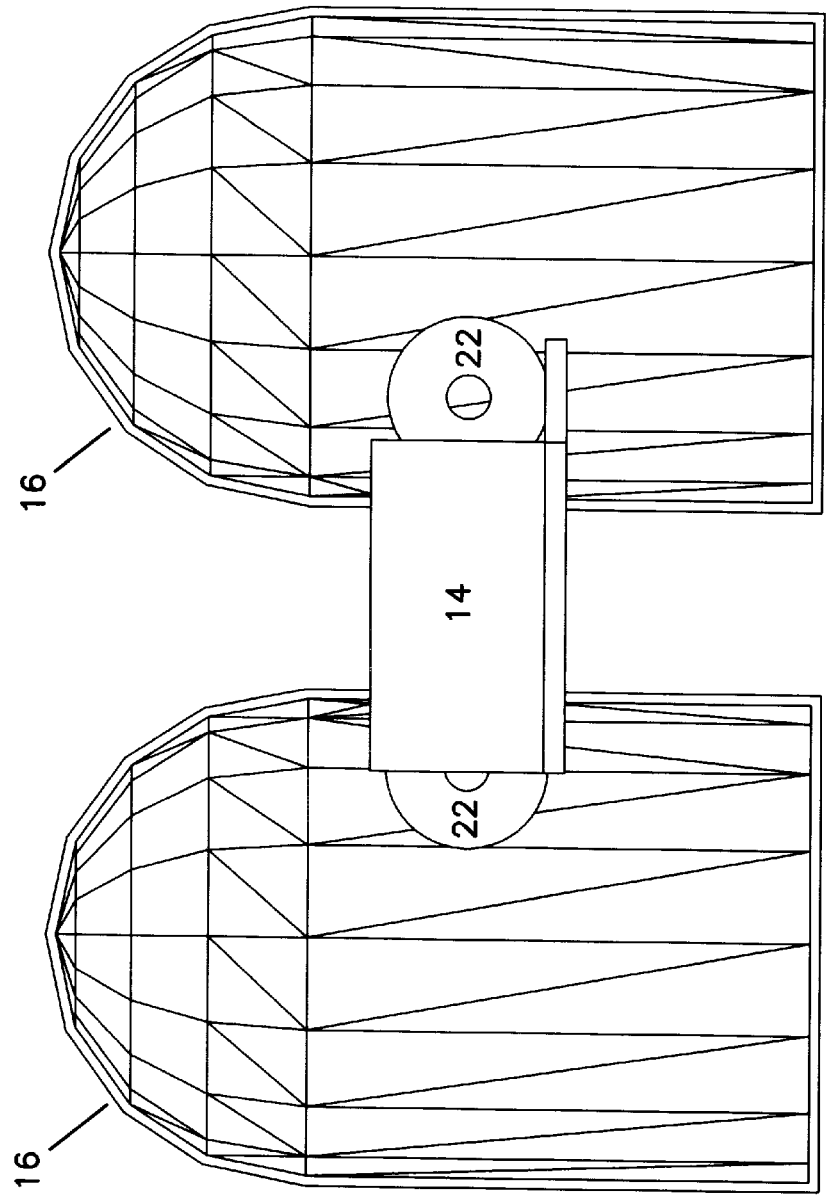
FIG. 3 is a side view, partially cut away, of a substantially touchless hydrodynamic transport chute bridging two modules for performing manufacturing process steps according to an embodiment of the invention.

FIG. 1 is a block diagram of a manufacturing system 10 including the substantially touchless hydrodynamic transport of objects between manufacturing process steps according to an embodiment of the invention. Manufacturing system 10 includes a load station 12, wet and dry substantially touchless hydrodynamic transport chutes 14, scrub modules 16, a spin-dry module 18, and an unload station 20. Wet substantially touchless hydrodynamic transport chutes 14 are coupled between the load station 12 and a scrub module 16, between scrub modules 16, and between a scrub module 16 and a spin-dry module 18, and transport objects therebetween. Dry substantially touchless hydrodynamic transport chute 14 is coupled between the spin-dry module 18 and the unload station 20, and transports objects therebetween. Load station 12 and unload station 20 may further include removable cassettes (not shown in FIG. 1) for storing objects to be delivered into the manufacturing system 10 or removed from the manufacturing system 10. It should be noted that FIG. 1 is merely representative, and that manufacturing system 10 may include any number of modules coupled together by substantially touchless hydrodynamic transport chutes 14. An illustration of the coupling of a substantially touchless hydrodynamic transport chute 14 between two process modules 16 is illustrated in FIGS. 2 and 3, wherein thin, disk-shaped objects such as magnetic recording disks 22 are shown both entering and leaving the substantially touchless hydrodynamic transport chute 14.

Referring again to FIG. 1, in embodiments of the invention unfinished (or unprepared) recording disks 22 are loaded into load station 12 for entry into the manufacturing system 10. Recording disks 22 may be held in cassettes insertable into the load station 12 in a manual or automated fashion. The load station then delivers a single recording disk 22 into the first wet substantially touchless hydrodynamic transport chute 14, where it is transported into the first scrub module 16. Within the first scrub module 16, the recording disk 22 may be mechanically scrubbed to remove contaminants. Hardware within the first scrub module 16 then aligns the recording disk 22 for insertion into the next wet substantially touchless hydrodynamic transport chute 14, where it is transported into the next scrub module 16. The scrubbing and transport steps are repeated until the recording disk 22 enters a spin-dry module 18, where the recording disk 22 is spun-dry. Hardware within the spin-dry module 18 then aligns the recording disk 22 for insertion into a dry substantially touchless hydrodynamic transport chute 14, where it is transported using air or gas as a fluid into an unload station 20. As with load station 12, the unload station 20 may unload recording disks 22 into removable cassettes within the unload station 20.

Figure 4:
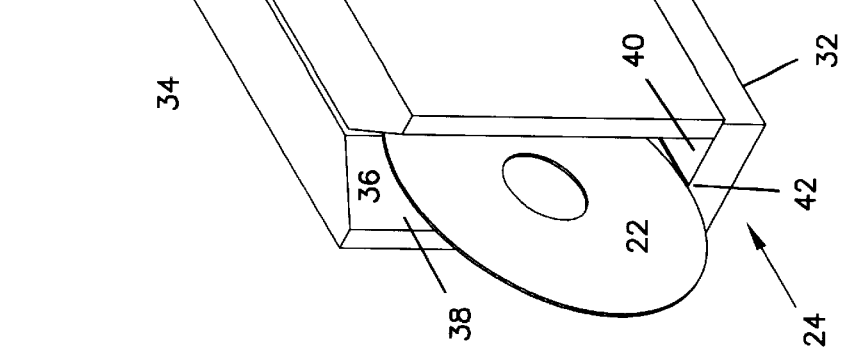
FIG. 4 is a perspective view of a substantially touchless hydrodynamic transport chute according to an embodiment of the invention.
Figure 5:
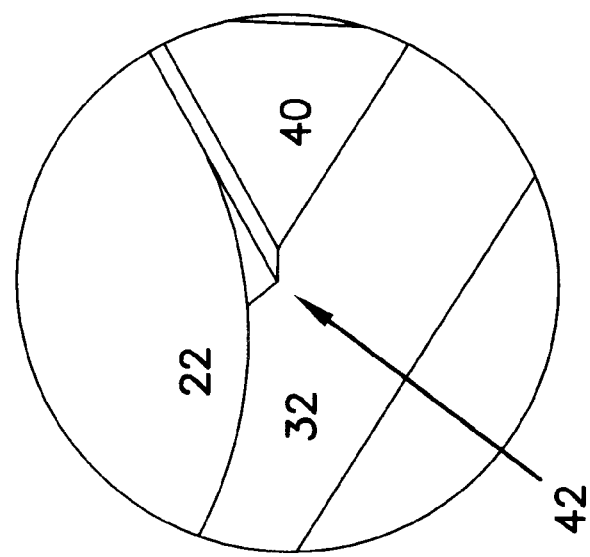
FIG. 5 is a close-up perspective view of a groove in a base of a substantially touchless hydrodynamic transport chute according to an embodiment of the invention.

FIG. 4 is a perspective view of a substantially touchless hydrodynamic transport chute 14 according to an embodiment of the invention. The substantially touchless hydrodynamic transport chute 14 embodied in FIG. 4 includes a generally rectangular-shaped housing 62, with an input side 24 on one of two narrow housing faces and an output side 26 on the narrow face opposite the input side 24. The housing 62 comprises a first wall 28 and second wall 30 coupled to a base 32. The first wall 28 and second wall 30 are separated by a narrow transfer slot 34 running the length of the housing 62. In preferred embodiments of the present invention the transfer slot 34 is 0.060" wide at the input side 24 and is tapered such that the transfer slot is 0.090" wide at the output side 26. However, in alternative embodiments of the present invention, the width of the transfer slot 34 may vary depending on the dimensions of the recording disk 22 to be transported and on the length of the chute. On the input side 24, the first wall 28 and second wall 30 are chamfered to form angled faces 36 and a mouth 38 for receiving and minimizing non-fluid bearing contact of the recording disks 22 against the walls of transfer slot 34. On an upper surface 40 of base 32, a groove 42 is formed the length of the base 32 in substantial alignment with transfer slot 34. The groove 42 aids in receiving and aligning recording disks 22 for entry into the transfer slot 34, and keeps the recording disk 22 bottom-centered in the transfer slot 34 as the recording disk 22 moves along the length of the transfer slot 34. A close-up view of a recording disk 22 seated in groove 42 formed in the upper surface 40 of base 32 is shown in FIG. 5.

Figure 6:
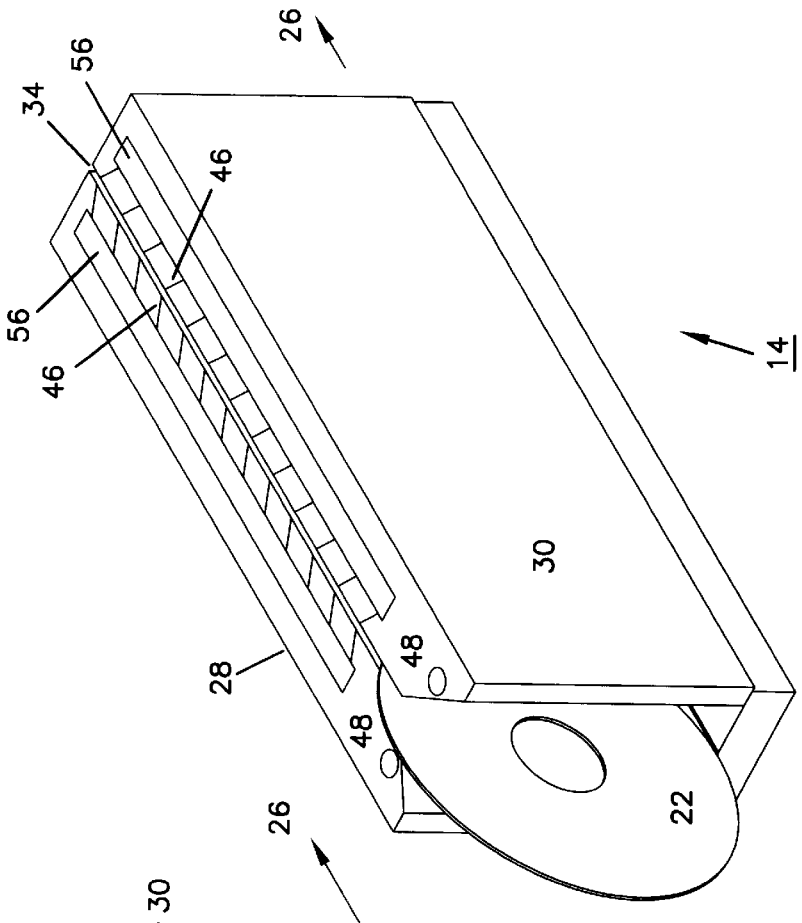
FIG. 6 is a perspective view, partially cut away, of a substantially touchless hydrodynamic transport chute showing channels and nozzles according to an embodiment of the invention.

FIG. 6 is a perspective view, partially cut away, of a substantially touchless hydrodynamic transport chute 14 wherein the upper portions of first wall 28 and second wall 30 have been cut away to reveal induction channels 48 and support channels 56 bored within first wall 28 and second wall 30. Bored within the first wall 28 and second wall 30 are support nozzles 46 leading from the support channels 56 to the transfer slot 34, angled to direct fluid towards the output side 26 of the transfer slot 34.

Figure 7:
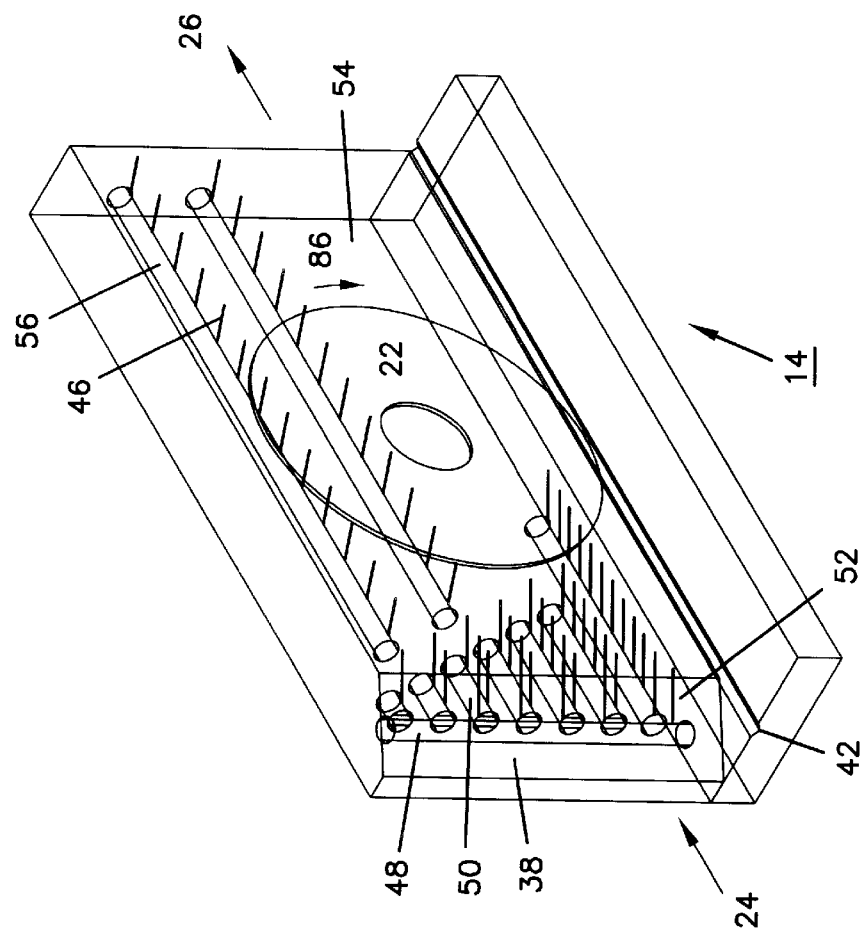
FIG. 7 is a perspective view, partially cut away, of a substantially touchless hydrodynamic transport chute revealing hidden interior channels and nozzles according to an embodiment of the invention.

FIG. 7 is a more detailed view of the substantially touchless hydrodynamic transport chute 14 where the second wall 30 has been cut away, revealing hidden interior channels and nozzles within the first wall 28 for purposes of discussion. Near the input side 24 of the substantially touchless hydrodynamic transport chute 14 and bored in the first wall 28 is a induction channel 48. Induction sub-channels 50 running longitudinally within the substantially touchless hydrodynamic transport chute 14 are also bored in the first wall 28 and are connected to the induction channel 48. Bored within the first wall 28 are induction nozzles 52 leading from the induction subchannels 50 to an inner first wall face 54 and angled to direct fluid flow towards the output side 26 of the substantially touchless hydrodynamic transport chute 14.

Figure 8:
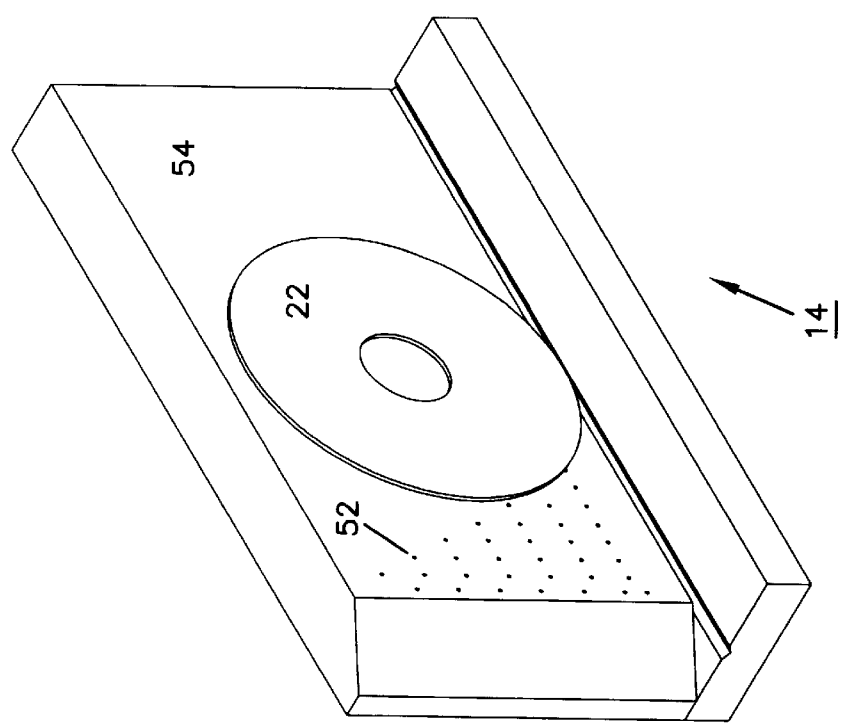
FIG. 8 is a perspective view, partially cut away, of a substantially touchless hydrodynamic transport chute showing nozzle locations according to an embodiment of the invention.

In preferred embodiments of the present invention illustrated in FIG. 8, the induction nozzles 52 form a generally triangular pattern in the inner first wall face 54. Induction of recording disks 22 into the substantially touchless hydrodynamic transport chute 14 is facilitated by fluid flow entering the induction channel 48 and flowing through the induction sub-channels 50, the triangularly placed induction nozzles 52, and finally into the transfer slot 34. The combination of the angled induction nozzles 52 and the tapered transfer slot 34 assist in forcing the fluid to flow from the input side 24 to the output side 26 of the transfer slot 34, creating a vacuum effect at mouth 38 such that fluid and any recording disk 22 in the area of the mouth 38 are pulled into the transfer slot 34. In addition to creating induction at the mouth 38, the triangular pattern of induction nozzles minimize eddy currents within the transfer slot 34.

FIG. 7 also illustrates a preferred embodiment of the present invention wherein support channels 56 are longitudinally bored in first wall 28. In addition, bored within the first wall 28 are support nozzles 46 leading from the support channels 56 to the inner first wall face 54 and angled to direct fluid flow towards the output side 26 of the substantially touchless hydrodynamic transport chute 14. The angled support nozzles 46 force fluid in the upper portion of the transfer slot 34 to flow towards the output side 26 of the transfer slot 34, providing impetus to the recording disk 22 traveling down the transfer slot 34 such that rolling motion 86 is induced in the recording disk 22. In addition, the angled support nozzles 46 produce a fluid bearing on the sides of the recording disk 22 to support the recording disk 22 as it rolls down the transfer slot 34. It should be noted that although the second wall 30 is not shown in FIGS. 7 and 8, the induction channel 48, induction sub-channels 50, angled induction nozzles 52, support channels 56, and angled support nozzles 46 of the first wall 28 are also found in the second wall 30.

In preferred embodiments, the flow of fluid into induction channels 48 and support channels 56 are independently controllable to produce sufficient induction and transport flows through the transfer slot 34. Sufficient induction and transport flows within the transfer slot 34 are also a function of the number, location, and configuration of channels and nozzles including bore sizes and nozzle angles, recording disk size, width, length, and taper of the transfer slot 34, how close recording disks will be placed to the mouth 38, and the configuration of the groove 42. Other factors to consider in designing the substantially touchless hydrodynamic transport chute 14 for sufficient induction and transport flows include fluid consumption, the desired speed of the recording disk 22 through the transfer slot 34, the sufficiency of the fluid bearings formed within the transfer slot 34, and the minimization of eddies and back-flow within the transfer slot 34 (to ensure that contaminants in the fluid flow are quickly removed from the transfer slot and do not settle back onto the recording disk 22 or the sides of the transfer slot 34).

Figure 9:
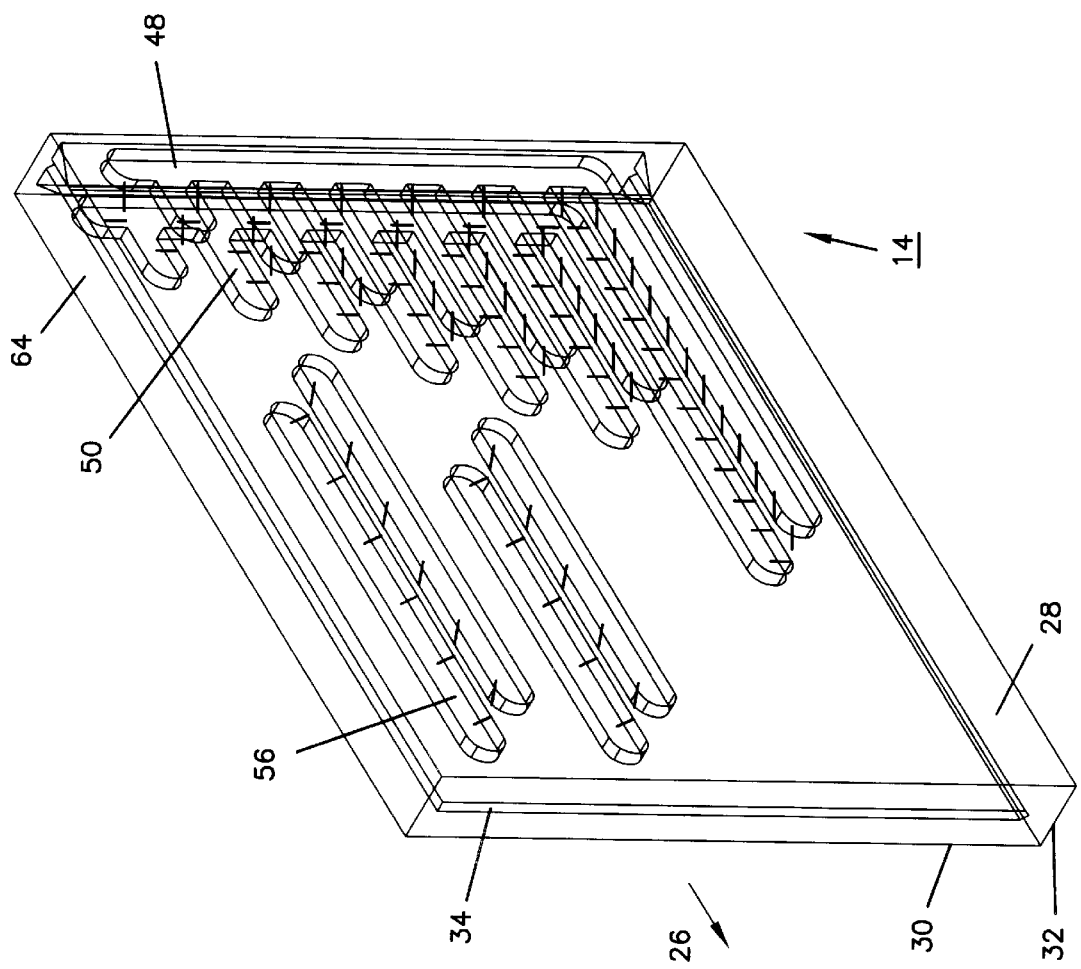
FIG. 9 is a perspective view, partially cut away, of a substantially touchless hydrodynamic transport chute revealing hidden interior channels and nozzles according to an embodiment of the invention.

FIG. 9 is a perspective view, partially cut away, of a substantially touchless hydrodynamic transport chute 14 according to an embodiment of the invention, where the first wall 28 and second wall 30 have been partially cut away to reveal hidden support channels 56, induction channels 48, and induction sub-channels 50. Note that in this embodiment, the first wall 28 and second wall 30 are seamlessly molded with the base 32, and that the top of transfer slot 34 is covered by an upper containment wall 64.

Figure 10:
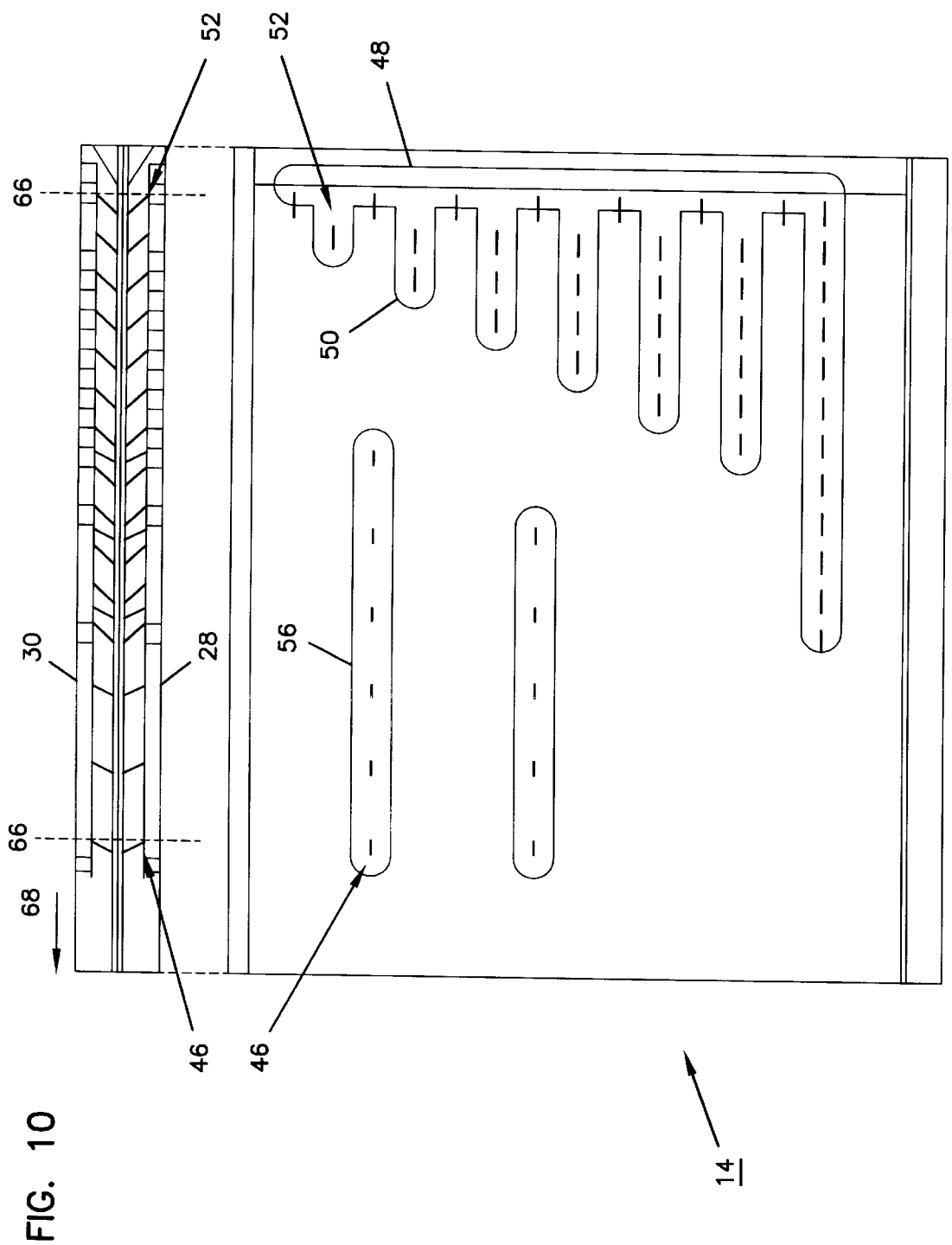
FIG. 10 is a side and top view, partially cut away, of a substantially touchless hydrodynamic transport chute showing nozzle angles according to an embodiment of the invention.

FIG. 10 is a side and top view, partially cut away, of a substantially touchless hydrodynamic transport chute 14 according to an embodiment of the invention, where the first wall 28 and second wall 30 have been partially cut away to reveal hidden support channels 56, induction channels 48, and induction sub-channels 50 for purposes of discussion. In the embodiment of FIG. 10, support nozzles 46 are angled 30 degrees from a line 66 perpendicular to the direction of travel 68 of the recording disk 22, and induction nozzles 52 are angled 45 degrees from the line 66 perpendicular to the direction of travel 68 of the recording disk 22. However, in alternative embodiments of the invention, the angles may vary and are dependent on a number of factors including, but not limited to, the length of transfer, fluid consumption, and transfer rate.

Figure 11:
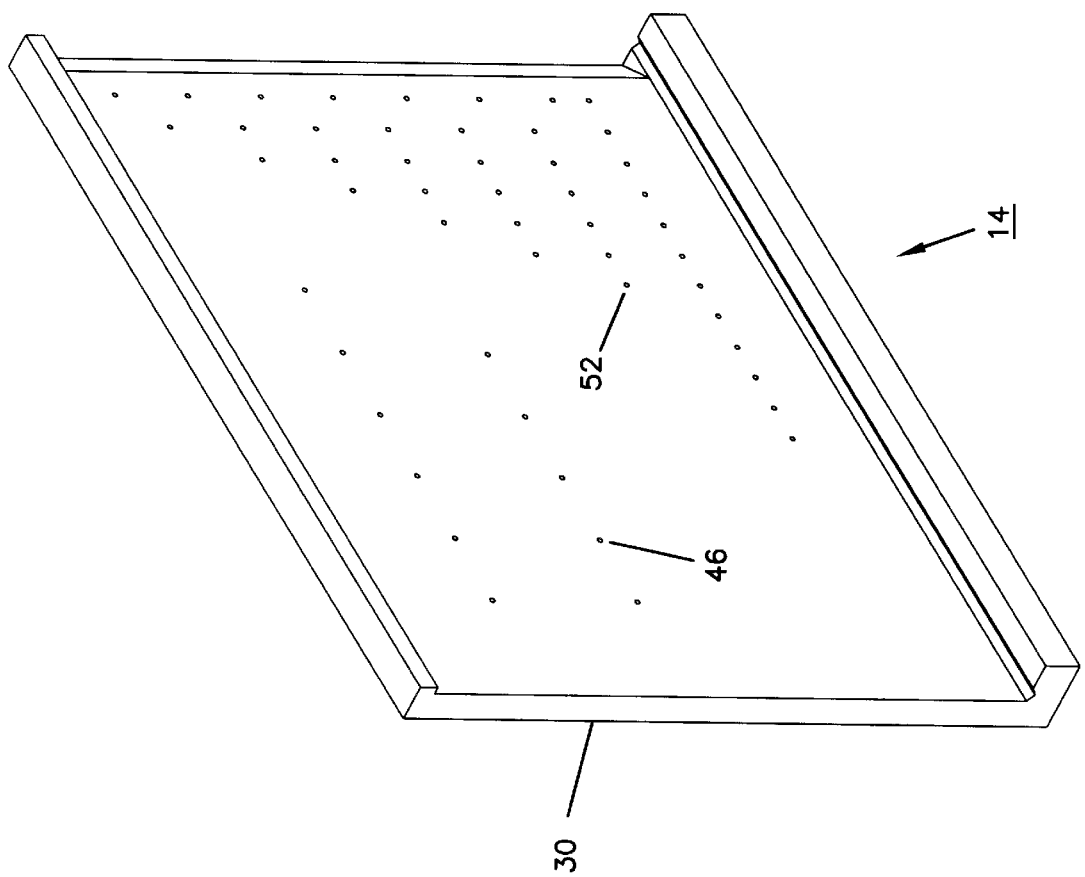
FIG. 11 is a perspective view, partially cut away, of a substantially touchless hydrodynamic transport chute showing nozzle locations according to an embodiment of the invention.

FIG. 11 is a perspective view, partially cut away, of a substantially touchless hydrodynamic transport chute 14 according to an embodiment of the invention. In FIG. 11, the first wall 28 has been removed to reveal the pattern of induction nozzles 52 and support nozzles 46 in the second wall 30. In the embodiment of FIG. 11, support nozzles 46 and induction nozzles 52 have a diameter of 0.020". However, in alternative embodiments of the invention, the diameters may vary and are dependent on a number of factors including, but not limited to, the length of transfer, fluid consumption, and transfer rate.

Figure 12:
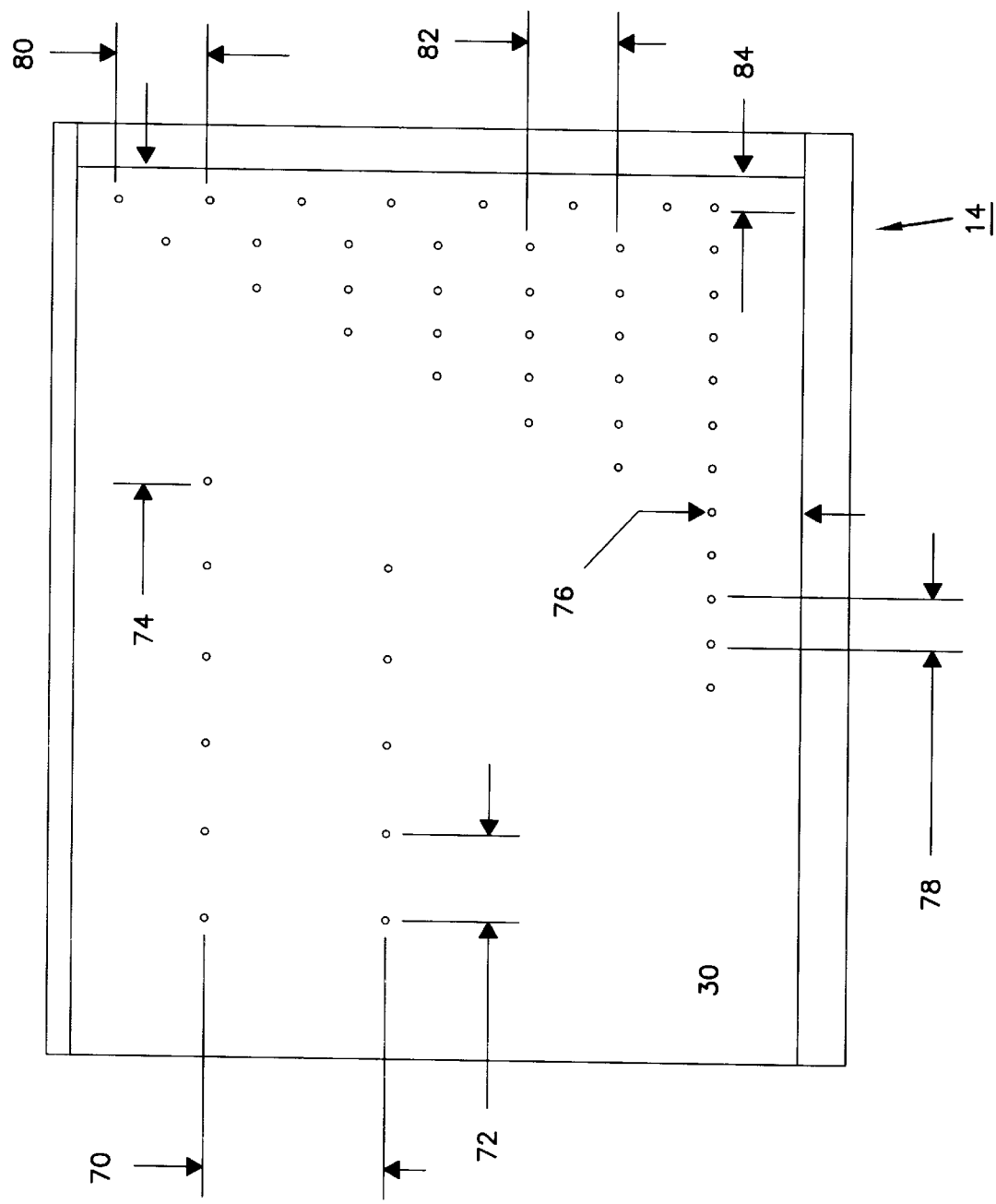
FIG. 12 is a side view, partially cut away, of a substantially touchless hydrodynamic transport chute showing nozzle placement according to an embodiment of the invention.

FIG. 12 is a side view, partially cut away, of a substantially touchless hydrodynamic transport chute 14 according to an embodiment of the invention. In the embodiment of FIG. 12, reference dimension 70 is approximately 1.0", reference dimension 72 is approximately 0.5", reference dimension 74 is approximately 1.78", reference dimension 76 is approximately 0.5", reference dimension 78 is approximately 0.25", reference dimension 80 is approximately 0.5", reference dimension 82 is approximately 0.5", and reference dimension 84 is approximately 0.185". However, in alternative embodiments of the invention, the dimensions may vary and are dependent on factors including, but not limited to, the length of transfer, fluid consumption, and transfer rate.

Figure 13:
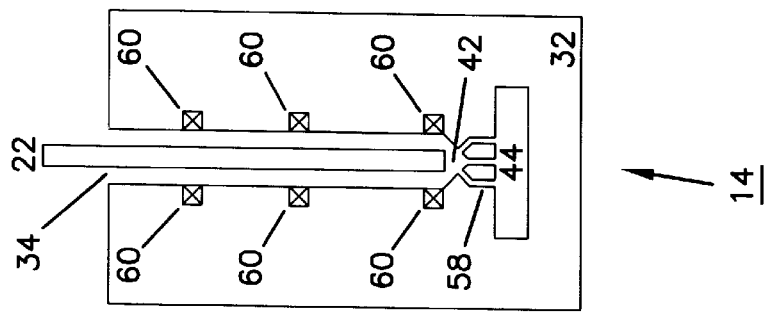
FIG. 13 is a partial end view of a substantially touchless hydrodynamic transport chute showing nozzles in a groove and ultrasonic/megasonic transducers in a transfer slot according to an embodiment of the invention.

In alternative embodiments of the present invention, the fluid bearing formed underneath the recording disk 22 within the fluid-filled groove 42 may be enhanced by the addition of at least one base channel 44 and groove nozzles 58 in the base 32, as illustrated in FIG. 13. In this embodiment, fluid flows from the base channel 44 into groove nozzles 58 and then into the groove 42, enhancing the fluid bearing formed underneath the recording disk 22.

Figure 15:
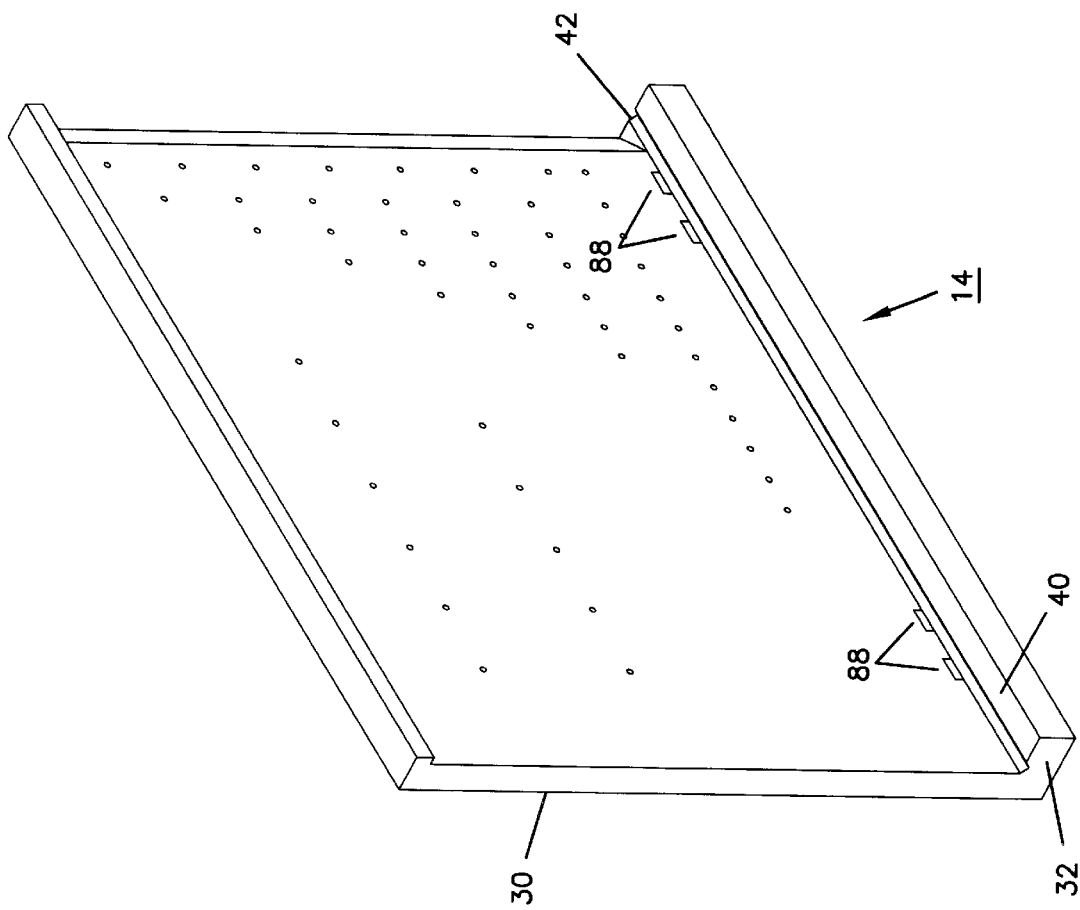
FIG. 15 is a perspective view, partially cut away, of a substantially touchless hydrodynamic transport chute showing drain locations according to an embodiment of the invention.

In other alternative embodiments of the present invention, one or more drains 88 are located along a length of the transfer slot 34 to remove fluid from the transfer slot. Draining may be facilitated by suction or gravity. Fluid removal within the substantially touchless hydrodynamic transport chute 14 may be important where chemistries or contaminants from an upstream processing step influence the chemistries of a downstream processing step, or when desired nozzle flow rates would force an excessive volume of fluid into the transfer slot 34. FIG. 15 is a perspective view, partially cut away, of a substantially touchless hydrodynamic transport chute 14 showing drain locations according to an embodiment of the invention. In FIG. 15, the first wall 28 has been removed to reveal the location of slot-shaped drains 88 in the lower portion of the second wall 30 near the groove 42. FIGS. 16–18 are top, side, and end views, respectively, of a substantially touchless hydrodynamic transport chute 14 showing further detail on the location of drains 88. However, in alternative embodiments of the invention, the drains 88 may be placed in other locations along the walls, or within the groove 42, depending on a number of factors including, but not limited to, the length of transfer, fluid consumption, and transfer rate.

In other alternative embodiments of the invention, the substantially touchless hydrodynamic transport chute 14 may be used not only for transport, but for cleaning as well. Thus, fluid flowing within the channels, nozzles, and transfer slot 34 of the substantially touchless hydrodynamic transport chute 14 may include chemistries for cleaning the recording disks 22 such as surfactants, alkalines, or acids in addition to water or air. Furthermore, referring to FIG. 13, transducers 60 may be mounted within inner wall faces, interspersed among the various nozzles, for ultrasonically or megasonically agitating fluid in the transfer slot 34 for additional cleaning of the recording disk 22 as it passes through the transfer slot 34.

It should be noted that although the preceding discussion focused on the transport of recording disks 22, embodiments of the present invention are not limited to the transport of recording disks. Objects capable of being transported through the substantially touchless hydrodynamic transport chute 14 may include, but are not limited to, magnetic recording media, semiconductor wafers, and glass, plastic, or metal articles. In addition, the previously noted rolling motion 86 of the recording disk 22 as it passes through the transfer slot 34 is not essential to the present invention, and therefore in alternative embodiments objects need not be disk-shaped, as objects of any consistently uniform size may be transported through the substantially touchless hydrodynamic transport chute 14 without the need for rolling if sufficient flow rates and fluid bearings are maintained by varying the number, location, flow rate, and configuration of channels and nozzles.

Figure 14:
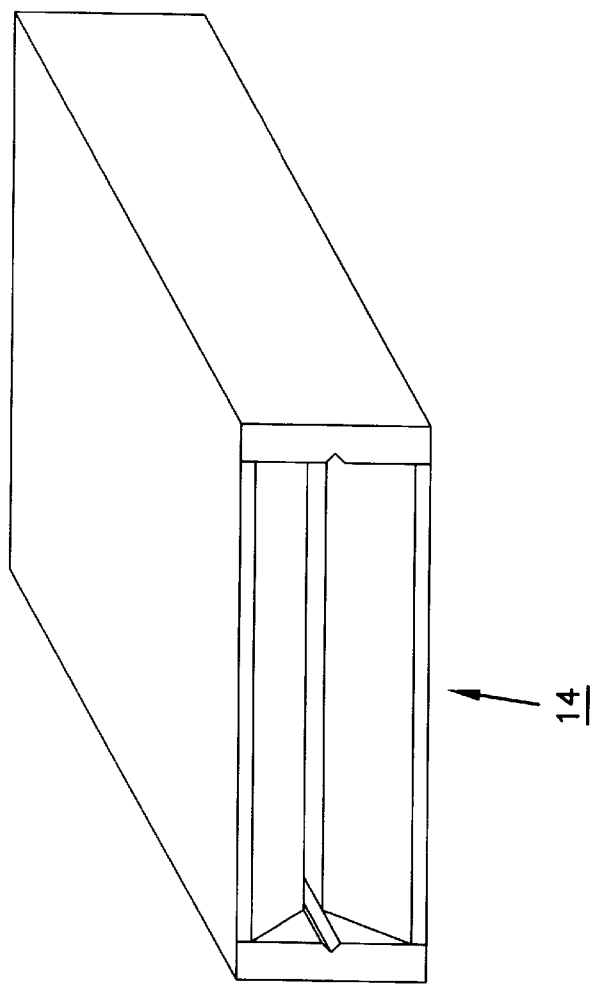
FIG. 14 is a perspective end view of a substantially touchless hydrodynamic transport chute in a horizontal configuration according to an embodiment of the invention.

It should also be noted that although FIGS. 1–13 and 15–18 illustrate a substantially touchless hydrodynamic transport chute 14 for transporting recording disks 22 in a vertical position, in alternative embodiments of the invention illustrated in FIG. 14, the substantially touchless hydrodynamic transport chute 14 may be configured for transporting recording disks in horizontal or even slanted orientations. Additionally, although the substantially touchless hydrodynamic transport chute 14 illustrated in FIGS. 1–18 receive and transport single recording disks 22, in alternative embodiments multiple chutes may be employed within a single housing 62 to transport recording disks 22 in parallel.

Therefore, according to the foregoing description, preferred embodiments of the present invention provide a system and method for the substantially touchless hydrodynamic transport of objects between manufacturing process steps that minimizes frictional wear and damage to the object, minimizes the chance of breakage of the object due to dropping or other mishandling, minimizes the introduction of contaminants, increases the speed and efficiency of the manufacturing process while decreasing its costs by simplifying the transport process, and allows additional process steps to be performed during the substantially touchless transportation process.

The foregoing description of preferred embodiments of the invention has been presented for the purposes of illustration and description. It is not intended to be exhaustive or to limit the invention to the precise form disclosed. It is intended that the scope of the invention be limited not by this detailed description, but rather by the claims appended hereto.

What is claimed is:

1. A system for hydrodynamically transporting objects in a substantially touchless manner, comprising:

a housing having a transfer slot for transporting objects through the housing; and means for generating fluid flow in the transfer slot to urge objects through the transfer slot and for generating fluid bearings in the transfer slot for preventing frictional contact of the object with the housing.

2. A system for performing processing steps on objects, comprising:

at least one processing module for performing a process step on objects: and at least one substantially touchless hydrodynamic transport chute coupled to the at least one processing module for transporting the object in a substantially touchless manner into and out of the at least one processing module wherein the substantially touchless hydrodynamic transport chute comprises:

a housing having a first wall, a second wall, and a base supporting the first and second walls;

a transfer slot formed between the first and second walls, the transfer slot having an input side and an output side; and nozzles formed in the first and second walls and directed into the transfer slot for creating fluid flow within the transfer slot, wherein the nozzles are angled into the transfer slot in a direction towards the output side of the transfer slot;

induction nozzles in the first and second walls near the input side of the transfer slot for inducing objects into the input side of the transfer slot wherein the induction nozzles form a generally triangular pattern in the first and second walls for increasing induction of objects into the input side of the transfer slot and minimizing eddy currents.

3. The system of claim 2, the nozzles further including:

support nozzles in the first and second walls along a length of the transfer slot for creating fluid flow and fluid bearings in the transfer slot and urging objects through the transfer slot.

4. The system of claim 2, further including:

a groove along a length of the base in substantial alignment with the transfer slot for receiving and bottom-centering objects in the transfer slot.

5. The system of claim 4, the base further including:

at least one groove nozzle directed into the groove for enhancing a fluid bearing formed within the groove.

6. The system of claim 2, further including: transducers directed into the transfer slot for agitation of fluid in the transfer slot for cleaning of the object as it passes through the transfer slot.

7. The system of claim 2, further including: drain holes in the first and second walls for removing fluid from the transfer slot.

8. The system of claim 2, wherein the transfer slot is tapered to be wider at the output side than the input side to assist the flow of fluid from the input side to the output side.

9. A method of hydrodynamically transporting objects between process modules in a substantially touchless manner, comprising:

flowing fluid through a transfer slot in a housing, the transfer slot having an input side and an output side;

forming fluid bearings within the transfer slot; and urging objects through the transfer slot along the fluid bearings under impetus from the fluid flow by injecting fluid directed towards the output side of the transfer slot into the transfer slot at a plurality of locations along a length of the transfer slot to urge the objects towards the output side of the transfer slot;

inducing objects into the input side of the transfer slot with induction nozzles that form a generally triangular pattern in the first and second walls for increasing induction of objects into the input side of the slot and minimizing eddy currents.

10. The method of claim 9, further including the step of:

bottom-centering objects in the transfer slot by forming a groove for receiving the objects in a base of the housing in substantial alignment with the transfer slot.

11. The method of claim 10, wherein the step of forming fluid bearings within the transfer slot further includes the step of:

injecting fluid into the groove to enhance the fluid bearing formed between the object and groove.

12. The method of claim 9, further including the step of:

agitating fluid in the transfer slot for cleaning of the object as it passes through the transfer slot.

13. The method of claim 9, further including the step of:

flowing fluid chemistries through the transfer slot for cleaning objects that pass through the transfer slot.

14. The method of claim 9, further including the step of:

tapering the transfer slot to be wider at the output side than the input side to assist the flow of fluid from the input side to the output side.

\* \* \* \* \*

UNITED STATES PATENT AND TRADEMARK OFFICE
CERTIFICATE OF CORRECTION

PATENT NO. : 6,241,427 B1  
DATED : June 5, 2001  
INVENTOR(S) : Hessburg et al.

It is certified that error appears in the above-identified patent and that said Letters Patent is hereby corrected as shown below:

Title page,  
Item [73], Assignee, should read -- Seagate Technology LLC --.

Column 10,  
Line 4, insert -- transfer -- between "the" and "slot".

Signed and Sealed this

Twenty-third Day of April, 2002

Attest:

Attesting Officer

JAMES E. ROGAN  
Director of the United States Patent and Trademark Office